(12) United States Patent
Bendat et al.

(10) Patent No.: US 6,781,775 B2
(45) Date of Patent: Aug. 24, 2004

(54) OPTICAL SYSTEM FOR ALIGNING A PAIR OF OBJECTS

(76) Inventors: Zvi Bendat, 45 E. 89$^{th}$ St., Apt. 27A, New York, NY (US) 10128; Miroslaw Sokol, 33 Tumble Rd., Bedford, NH (US) 03110

(*) Notice: Subject to any disclaimer, the term of this patent is extended or adjusted under 35 U.S.C. 154(b) by 0 days.

(21) Appl. No.: 10/272,526

(22) Filed: Oct. 16, 2002

(65) Prior Publication Data

US 2004/0075918 A1 Apr. 22, 2004

(51) Int. Cl.$^7$ ................................................ G02B 5/04
(52) U.S. Cl. .................... 359/834; 359/861; 356/399; 356/614
(58) Field of Search ................. 359/831, 833, 359/834, 836, 857, 861; 356/153, 399, 400, 614

(56) References Cited

U.S. PATENT DOCUMENTS

| | | |
|---|---|---|
| 3,614,238 A | 10/1971 | Stites |
| 3,681,521 A | 8/1972 | Doi et al. |
| 3,843,036 A | 10/1974 | Monahan et al. |
| 4,167,677 A * | 9/1979 | Suzki .......................... 356/401 |
| 4,171,869 A | 10/1979 | Higuchi et al. |
| 4,608,494 A | 8/1986 | Kobayashi et al. |
| 4,899,921 A | 2/1990 | Bendat et al. |
| 5,044,072 A | 9/1991 | Blais et al. |
| 5,212,880 A | 5/1993 | Nishiguchi et al. |
| 5,262,355 A | 11/1993 | Nishiguchi et al. |
| 5,311,288 A * | 5/1994 | Shahar ........................ 356/623 |
| 5,457,538 A * | 10/1995 | Ujiie ............................ 356/399 |
| 5,532,815 A * | 7/1996 | Kipman et al. .......... 356/139.03 |
| 5,570,231 A | 10/1996 | Mogamiya |
| 5,629,767 A * | 5/1997 | Tchejeyan ..................... 356/153 |
| 5,680,698 A | 10/1997 | Armington et al. |
| 5,903,356 A * | 5/1999 | Shiraishi ....................... 356/399 |
| 6,135,340 A | 10/2000 | Stansbury |
| 6,160,665 A | 12/2000 | Yuan |

* cited by examiner

Primary Examiner—Mark A. Robinson
(74) Attorney, Agent, or Firm—McCarter & English, LLP

(57) ABSTRACT

An optical probe for use in accurately aligning the surfaces of microelectronic components that are to be joined together includes an optical device adapted to superimpose the images of a pair of components positioned on either side of the device. The optical device comprises an optical beam-splitter and plurality of prisms having mirror surfaces arranged so that the superposition of images takes place at the partially reflective interface within the beam-splitter. The resulting superimposed image of the die and substrate is displaced laterally from the microelectronic components so that the image is not projected onto either component.

17 Claims, 4 Drawing Sheets

OPTICAL SYSTEM FOR ALIGNING A PAIR OF OBJECTS

FIELD OF THE INVENTION

This invention relates to an apparatus for effecting the precise alignment of surfaces that are to be joined together. In particular, the invention relates to an optical system adapted for use in aligning an integrated circuit wafer or microchip with a patterned substrate.

BACKGROUND OF THE INVENTION

The development of apparatuses for the precise alignment of surfaces that are to be joined together continues to be active. This is particularly the case in the area of microelectronic fabrication, where the patterns that are to be aligned are microscopic or nearly microscopic in scale. One such pattern may be on a surface of an integrated circuit wafer or an individual microchip and may comprise a variety of connectors, such as metallic wires or ribbons, or tiny bumps of solder, conductive epoxy or indium, that are formed thereupon. The complementary pattern typically would be on a surface of a substrate and would comprise a pattern of tiny pads or conductors to provide electrical connections to the microchip or to another patterned substrate.

In the commercial production of microelectronic devices, a die may be attached to a substrate during an automated process. In some approaches, the patterns of the die and substrate are aligned directly with each other, or reference marks for guiding alignment may be provided on the components or component carriers. Accurate alignment of components or reference marks may be facilitated using an optical system that provides enlarged images of the components superimposed one upon the other. A typical optical system is illustrated in FIG. 1. The optical system 1 includes an optical cube beam-splitter 2 and an image processor 3, which may contain components such as one or more cameras, a video monitor, and circuitry for signal processing and control of the assembly process. A die 4 having connector bumps 5a, 5b is suspended above the beam-splitter 2 by means of a die carrier 6. Suction applied through a port 8 holds the die 4 against the die carrier 6 during the assembly operations. A substrate 10 having electrical contacts 12, 14 is positioned beneath the beam-splitter 2 on a substrate carrier 16. Reference marks A, B are provided on the die 4 and reference marks A', B' are provided on the substrate 10 to facilitate the accurate alignment, and hence, attachment, of the bumps 5a, 5b with the electrical contacts 12, 14, respectively.

Still referring to FIG. 1, the beam-splitter 2 is provided with two similar triangular optical prisms 18 and 20. The prism 18 has a transparent face 22, a 100% reflective mirror face 24 and a hypotenuse face 26, with the faces 22, 24 being perpendicular to each other. The prism 20 has a transparent face 28, a transparent face 30 and a hypotenuse face 32, with the faces 28, 30 being perpendicular to each other. Each prism 18, 20 also has a 45° angle between the faces 24, 30 and the respective hypotenuse faces 26, 32. The prisms 18, 20 contact each other at their respective hypotenuse faces 26, 32, forming an interface 34 along the plane of contact. One or both of the hypotenuse faces 26, 32 is coated with a reflective material, such as a metal or a reflective dielectric material. Typically, these coatings provide the interface 34 with a reflectance of 50%, i.e, half of the light striking the interface 34 will be reflected and half will pass through the interface 34.

Light, provided by a source of illumination (e.g., a lamp) and striking the die 4, is reflected as an image of the die 4 comprising light beams 36a, 36b which pass through the face 28 of the prism 20 and strike the interface 34. A portion 38a, 38b of each light beam 36a, 36b is reflected by the interface 34 at a 90° angle of rotation. The reflected portions 38a, 38b exit the prism 20 through the face 30 and is received by the image processor 3.

Light, provided by a source of illumination (e.g., a lamp) and striking the substrate 10, is reflected as an image of the substrate 10 comprising light beams 41a, 41b which pass through the face 22 of the prism 18 and strike the interface 34. A portion 43a, 43b of each light beam 41a, 41b is reflected by the interface 34 at a 90° angle of reflection and is reflected back to the interface 34 by the mirror face 24, thereby being transmitted to the image processor 3.

The resulting image, viewed at the face 30 of the prism 20, comprises images of the die 4 and the substrate 10 superimposed upon each other. Image processing software can be used to determine the relative locations of the reference marks A, B relative to the reference marks A', B' respectively, and to signal an associated control system to move the die carrier 6 and/or the substrate carrier 16 until the reference marks A, B are accurately aligned with the reference marks A', B', respectively.

The alignment method described above has various disadvantages and shortcomings. For example, with reference to FIG. 1, portions 40a, 40b of the light beams 36a, 36b (i.e., the image of the die 4) pass through the interface 34, project an image of die 4 onto the substrate 10, and are then reflected back to the beam splitter 2 from the substrate 10. Similarly, portions 45a, 45b of the light beams 41a, 41b (i.e., the image of the substrate 10) pass through the interface 34, project an image of the substrate 10 onto the die 4, and are then reflected back to the beam-splitter 2 from the die 4. These reflected images create interference fringes or blurring of the image received by the image processor 3. Such effects can increase the difficulty of accurately aligning the die 4, and the substrate 10 with each other.

One approach to overcoming this problem is to generate separate images of the die 4 and substrate 10, and combine the images digitally. For example, if the interface 34 were made to be 100% reflective, the image processor 3 would receive only the image of the die 4 at the face 30 of the prism 20. A second image processor would be provided to capture the image of the substrate 10 at the face 24 of the prism 18 (which is made to be transparent), and the two images would be superimposed by digital manipulation (see, e.g., U.S. Pat. No. 4,899,921 to Bendat, et al.). Besides the increased cost of equipment to capture and combine two images, it would be necessary to carefully calibrate the image processors to accurately track the positions of the die carrier 6 and the substrate carrier 16 relative to each other.

SUMMARY OF THE INVENTION

The present invention overcomes the disadvantages and shortcomings of the prior art discussed above by providing a new and improved optical device adapted to superimpose the image of a die positioned at one side of the device and the image of a substrate positioned at an opposite side of the device. In one embodiment, the device comprises a plurality of reflective surfaces arranged so that the superposition of images takes place at a partially reflective surface within the probe. The superimposed image is displaced laterally from the die and the substrate. Neither the superimposed image nor the individual images of the die or the substrate is projected onto either component. Preferably, the optical device comprises a pair of right triangular prisms, each having a mirror hypotenuse face, a pentaprism having a pair of opposed inclined mirror faces, and an optical cube beam-splitter comprising the partially reflective surface.

In another embodiment, the optical device is a component of a single-camera optical probe for use in aligning the die with the substrate. The camera receives the superimposed image of the die and the substrate together that is produced at the partially reflective interface, and converts the image to a digital signal. The image received by the camera can, thereby, be monitored by image recognition software or by an operator to observe and correct the alignment of the die and the substrate.

BRIEF DESCRIPTION OF THE DRAWINGS

For a more complete understanding of the present invention, reference is made to the following detailed description of the present invention considered in conjunction with the accompanying drawings, in which.

DETAILED DESCRIPTION OF THE EXEMPLARY EMBODIMENTS

Figure 2:
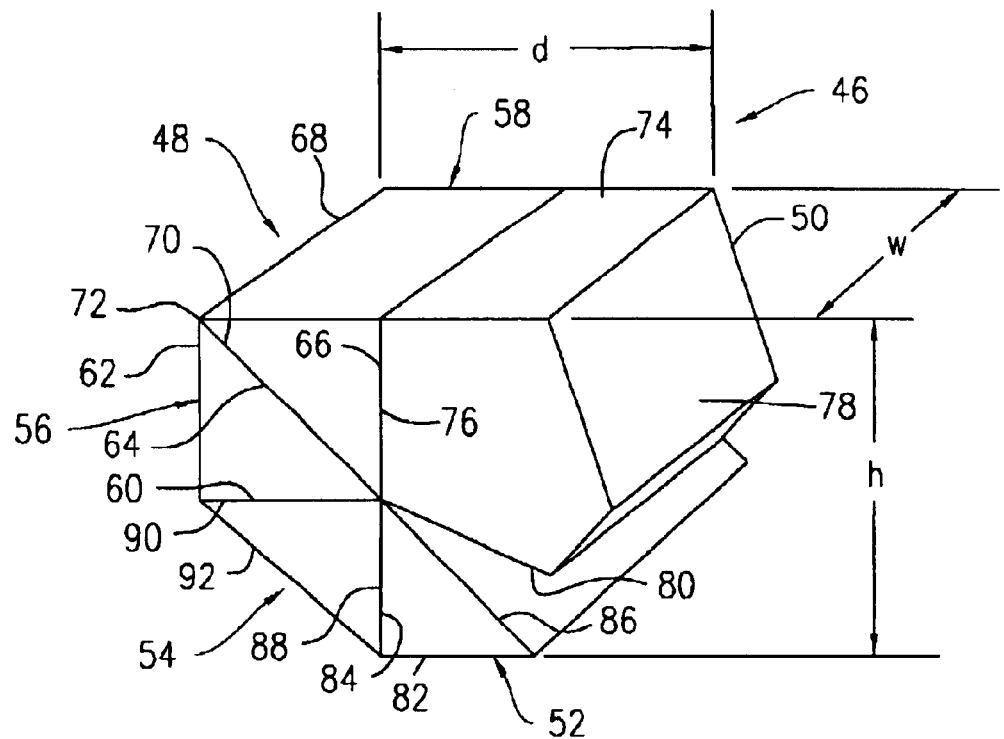
FIG. 2 is a perspective view of a prism assembly constructed in accordance with the present invention.

Referring to FIG. 2, a preferred embodiment of the present invention includes a prism assembly 46 having an optical cube beam-splitter 48, a pentaprism 50, and a pair of triangular optical prisms 52, 54. Preferably, the beam-splitter 48, pentaprism 50, and triangular prisms 52, 54 of the prism assembly 46 are made of optical grade materials, such as natural fused silica, synthetic fused silica, or of an optical glass such Schott BK7 or Schott SF11 (Schott Corporation, 3 Odell Plaza Yonkers, N.Y. 10701), or analogues thereof. The faces (to be discussed hereinafter) of the beam-splitter 48 and of each prism 50, 52, 54, preferably, are polished flat and the external faces of the prism assembly 46 may be provided with an anti-reflective coating. The reflective faces (to be discussed hereinafter) of the beam-splitter 48 and the prisms 50, 52, 54 of the prism assembly 46 are provided with a reflective coating, such as a metal or dielectric material. Preferably, the prism assembly 46 has small dimensions. For example, the prism assembly 46 can be provided with a height h of 10 mm, a width w of 5 mm and a depth d of 10 mm.

To facilitate consideration and discussion, a prism face shall be referred to hereinafter as being "transparent" or "partially transparent" if it passes some stated percentage of light impinging on the prism face. Similarly, a prism face shall be referred to hereinafter as being "reflective" or "partially reflective" if it reflects some stated percentage of light impinging on the prism face. A face or surface that is about 100% reflective may be referred to hereinafter as a "mirror face".

Figure 3:
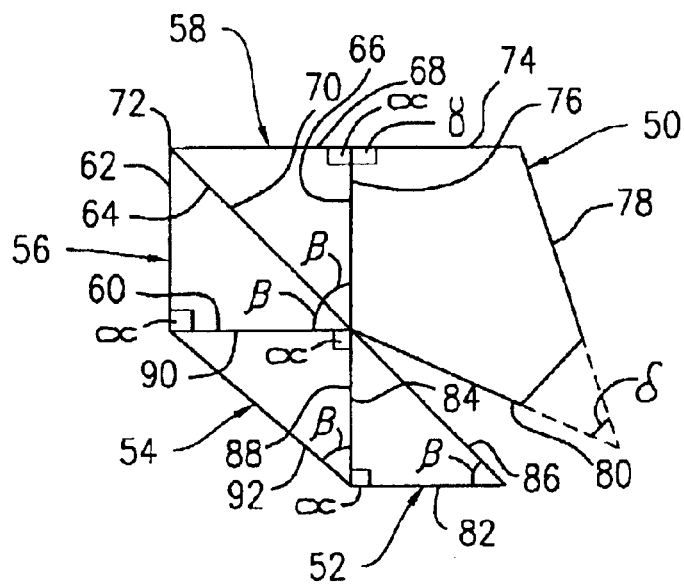
FIG. 3 is a side elevational view of the prism assembly shown in FIG. 2.

Referring to FIGS. 2 and 3, the beam-splitter 48 comprises two triangular optical prisms 56, 58. The prism 56 has a pair of mutually perpendicular transparent faces 60, 62 and a hypotenuse face 64, while the prism 58 has a pair of mutually perpendicular transparent faces 66, 68 and a hypotenuse face 70. The hypotenuse face 64 of the prism 56 is congruent with the hypotenuse face 70 of the prism 58 and is flush-mounted thereto, forming an interface 72. One or both of the hypotenuse faces 64, 70 is partially reflective so that the interface 72 is about 50% reflective to light passing in either direction through the interface 72. Preferably, the faces 60, 62 of the prism 56 and the faces 66, 68 of the prism 58 are about 100% transparent.

Still referring to FIGS. 2 and 3, the pentaprism 50 has a pair of mutually perpendicular transparent faces 74, 76, and a pair of opposed inclined mirror faces 78, 80. The face 76 of the pentaprism 50 is congruent with the face 66 of the prism 58 and is flush-mounted thereto. Preferably, the faces 74, 76 are about 100% transparent.

The triangular prism 52 has a pair of mutually perpendicular transparent faces 82, 84 and a mirror hypotenuse face 86. The triangular prism 54 is similar in arrangement to the triangular prism 52, having a pair of mutually perpendicular transparent faces 88, 90 and a mirror hypotenuse face 92. Preferably, the faces 82, 84, 88, 90 are about 100% transparent. The face 84 of the prism 52 is congruent with the face 88 of the prism 54 and is flush-mounted thereto, such that the hypotenuse face 86 of the prism 52 is parallel to the hypotenuse face 92 of the prism 54.

Referring to FIG. 3, each of the four triangular prisms 52, 54, 56, 58 has the shape of a 45° right triangular prism, i.e., the angle α opposite each hypotenuse face 64, 70, 86, 92 is a 90° angle and each hypotenuse face 64, 70, 86, 92 forms a 45° angle β with its respective adjoining face 60, 66, 82, 92. The faces 60, 62 of the prism 56, the faces 66, 68 of the prism 58, the faces 82, 84 of the prism 52, and the faces 88, 90 of the prism 56 are each congruent with the others. The transparent faces 74, 76 of the pentaprism 50 form a 90° angle γ and are congruent with the face 66 of the triangular prism 58. The planes of the opposed inclined faces 78, 80 of the pentaprism 50 intersect to form a 45° angle δ. Although not necessary to the invention, it is preferred that the angle formed by the face 74 and the inclined face 78 be equal to the angle formed by the face 76 and the inclined face 80, with the result that the pentagonal base of the pentaprism 50 is symmetrical about a line passing through the apex of the angle γ and the apex of the angle δ. The pentaprism 50 functions to rotate the centerline of an image by 90° while maintaining the orientation of the image, i.e., an image positioned in front of the face 74 will appear in the same orientation when viewed at the face 76.

Figure 4B:
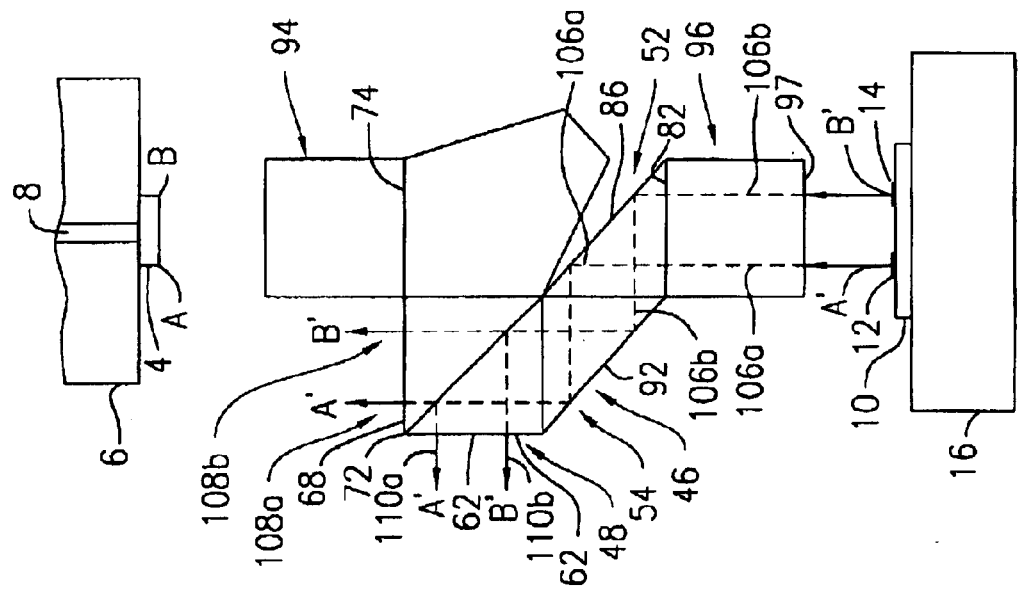
FIG. 4b is a schematic view of the optical probe shown in FIG. 4a, illustrating the reflective path of the image of a substrate.
Figure 4A:
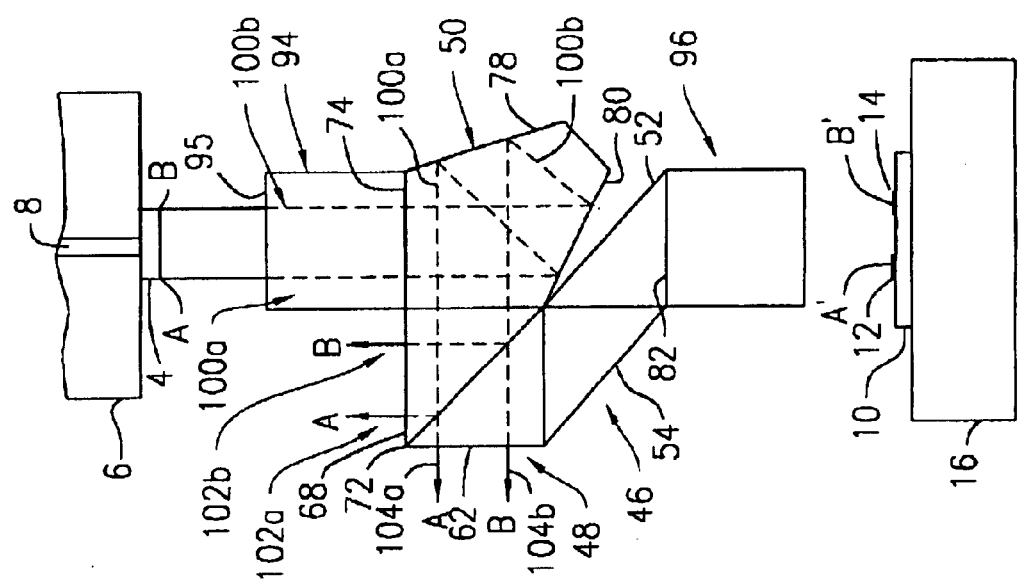
FIG. 4a is a schematic view of an optical probe equipped with the prism assembly of FIG. 2 and arranged between a die carrier and a substrate carrier, illustrating the reflective path of the image of a die.
Figure 5:
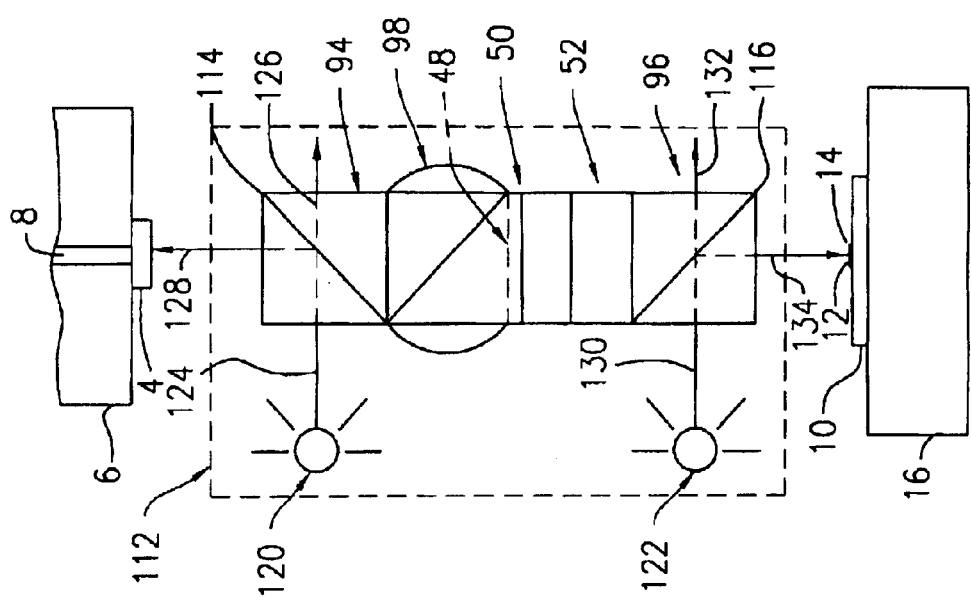
FIG. 5 is a schematic rear view of the optical probe shown in FIG. 4c, illustrating a pair of light sources arranged to illuminate the die and the substrate.

Referring to FIG. 4a, the prism assembly 46 can also be provided with an optical cube beam-splitter 94 and an optical cube beam-splitter 96. More particularly, the beam-splitter 94 is attached to the face 74 of the pentaprism 50, while the beam-splitter 96 is attached to the face 82 of the prism 52. Referring to FIG. 5, the beam-splitter 94 is provided with a partially reflective interface 114, while the beam-splitter 96 is provided with a partially reflective interface 116. Preferably, each of the partially reflective interfaces 114, 116 has a reflectance of about 50%. Sources of illumination, such as lamps 120, 122, are positioned in proximity to the beam-splitters 94, 96 (e.g., at a lateral side of the prism assembly 46) for illuminating the die 4 and the substrate 10 as will be discussed in more detail hereinafter.

Figure 1:
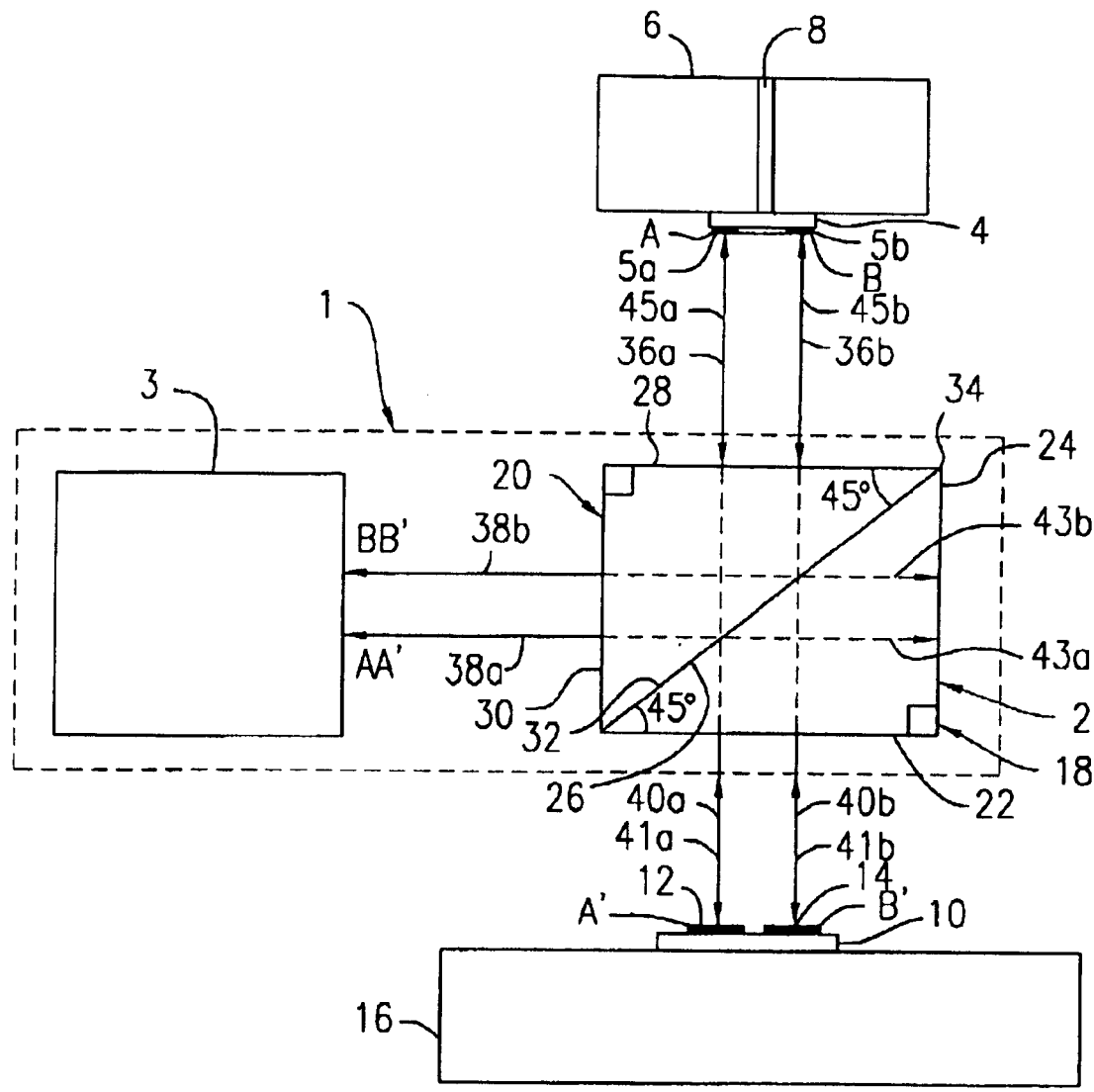
FIG. 1 is a schematic representation of a type of optical system known in the prior art as it is used in a microelectronic assembly process.
Figure 4C:
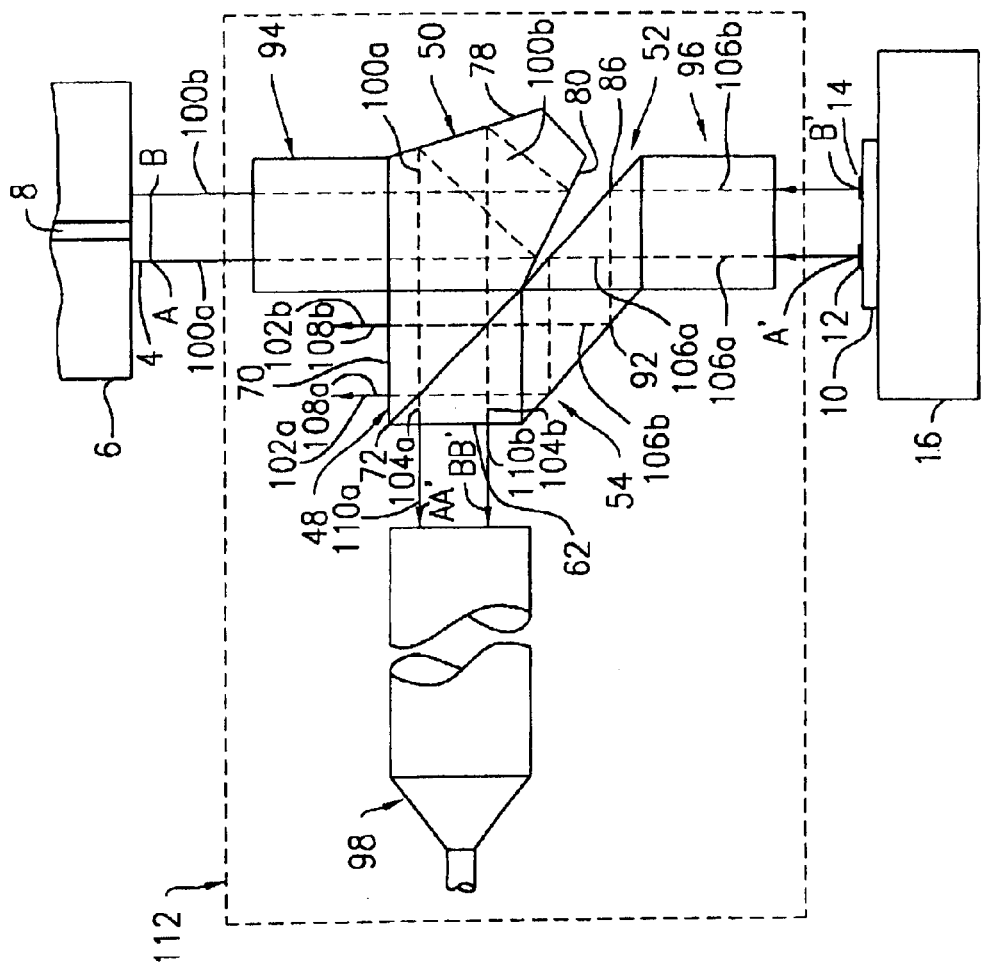
FIG. 4c is a schematic view of the optical probe of FIG. 4a arranged with a single camera, illustrating the superposition of the image of the die and the image of the substrate.

Now referring to FIGS. 4a–4c, the prism assembly 46 operates to superimpose the images of a die 4 and a substrate 10, thereby enabling the observation of the alignment of electrically conductive bumps 5a, 5b (see FIG. 1) of the die 4 with electrical connections 12, 14 (see FIG. 1) of the substrate 10. The die 4 and the substrate 10 have reference marks A, B and reference marks A', B', respectively, which are used to align the bumps 5a, 5b with the electrical connections 12, 14. The beam-splitters 94, 96 are oriented so that light beams, 124, 130, transmitted from the lamps 120, 122, respectively, are partially reflected by the interfaces 114, 116, respectively. The portion 126 of the light beam 124 that passes through the interface 114 exits the beam-splitter 94, while the reflected portion 128 of the light beam 124 is directed toward the die 4 for illuminating same. Likewise, the portion 132 of the light beam 130 that passes through the interface 116 exits the beam-splitter 96, while the reflected portion 134 of the light beam 130 is directed toward the substrate 10 and illuminates same.

When illuminated by the lamp 120, an image of the die 4, as represented by a light beam 100a (i.e., the image of the reference mark A) and a light beam 100b (i.e., the image of the reference mark B) in FIG. 4a, passes through a face 95 of the beam-splitter 94, where a portion (not shown) of each light beam 100a, 100b is rotated in a direction perpendicular to the plane of FIG. 4a, and the remainder of each light beam 100a, 100b is passed through the face 74 of the pentaprism 50. The light beams 100a, 100b are reflected by the inclined mirror faces 78, 80 of the pentaprism 50 and are rotated, thereby, counterclockwise 270°, which is, in effect, a 90° clockwise rotation, relative to their initial direction. The light beams 100a, 100b then pass through the beam-splitter 48. The 50% reflective interface 72 reflects a portion 102a, 102b of each light beam 100a, 100b toward the face 68 of the beam-splitter 48 and allows the other portion 104a, 104b to pass therethrough toward the face 62 of the beam-splitter 48. As can be seen in FIG. 4a, the orientation of the images of the reference marks A, B have the same orientation relative to the face 62 of the beam-splitter 48 as the reference marks A, B have to the face 95 of the beam-splitter 94.

When illuminated by the lamp 122, an image of the substrate 10, as represented by a light beam 106a (i.e., the image of the reference mark A') and a light beam 106b (i.e., the image of the reference mark B') in FIG. 4b, passes through a face 97 of the beam-splitter 96, where a portion (not shown) of each light beam 106a, 106b is rotated to a direction perpendicular to the plane of FIG. 4b, and the remainder of each light beam 106a, 106b is passed through the face 82 of the prism 52. The light beams 106a, 106b are reflected by the mirror hypotenuse face 86 of the prism 52 and are thereby rotated 90° counterclockwise relative to their original direction. The light beams 106a, 106b are then reflected by the mirror hypotenuse face 92 of the prism 54 and are thereby rotated 90° clockwise, returning to their original direction and orientation. The light beams 106a, 106b then pass through the beam-splitter 48. The 50% reflective interface 72 reflects a portion 110a, 110b of each light beam 106a, 106b toward the face 62 of the beam-splitter 48 and allows the other portion 108a, 108b to pass therethrough toward the face 68 of the beam-splitter 48. As can be seen in FIG. 4b, the orientation of the images of the reference marks A', B' has been inverted from the orientation of the reference marks A', B'.

Referring to FIG. 4c, the prism assembly 46, the cube beam-splitters 94, 96 and a camera 98 are combined in an optical probe or system 112. The probe 112 is placed between a die carrier 6 and a substrate carrier 16 similar to those shown in FIGS. 4a and 4b. The camera 98 receives the superimposed images of the die 4 and the substrate 10 transmitted from the face 62 of the beam-splitter 48. In other words, the camera 98 receives the light beams 104a, 104b (i.e., images of the reference marks A, B, respectively) and the light beams 110a, 110b (i.e., images of the reference marks A', B', respectively). The image of the die 4 with the reference marks A, B that are transmitted to the camera 98 from the prism assembly 46 has the same orientation as the image of the substrate 10 with the reference marks A', B', because reflection within the pentaprism 50 maintains the orientation of the image of the die 4 while the sequence of three 90° rotations in the prisms 52, 54 and the beam-splitter 48 inverts the orientation of the image of the substrate 10. As a result, the image of the reference mark A is superimposed on the image of the reference mark A' and the image of the reference mark B is superimposed on the image of the reference mark B' when the respective marks on the die 4 and the substrate 10 are aligned. The alignment of the die 4 and substrate 10 can be monitored, therefore, at a remote station, such as a video monitor, by observing the alignment of the images of the reference marks A, B with the images of the reference marks A', B', respectively.

Because the images of the die 4 and of the substrate 10 are combined by the prism assembly 46, a single camera 98 can be used to monitor the alignment of the bumps 5a, 5b of the die 4 and the electrical connectors 12, 14 of the substrate 10. Because the beam-splitter 48 is laterally off-set from the die 4 and the substrate 10, the images comprising the light beams 102a, 102b and the light beams 108a, 108b (i.e., the image of the die 4 as reflected by the interface 72 and the image of the substrate 10 as passed through the interface 74) are laterally displaced from the die 4 and the substrate 10 (see FIG. 4c), and do not reflect back from those components to the prism assembly 46, as occurs in the prior art device of FIG. 1. As a result, the prism assembly 46 inhibits the formation of interference patterns or the blurring that are presented by optical probes using a single conventional optical cube beam splitter (see FIG. 1). It is, therefore, possible to accurately align the bumps 5a, 5b (see FIG. 1) of the die 4 and the electrical connectors 12, 14 (see FIG. 1) of the substrate 10 without the use of additional electronic circuitry in the monitoring system to correct for such effects. The use of the prism assembly 46 also makes it unnecessary to use two separate cameras to receive the images of a die and a substrate individually or to perform the painstaking calibrations that are required to coordinate the manipulation of the images received by the cameras with the movement of the die carrier 6 and substrate carrier 16. The small height of the prism assembly 46 with the optical cube beam-splitters 94, 96 (about 20 mm) also allows the die 4 and substrate 10 to be placed closely to each other during alignment, reducing the likelihood of lateral misalignment of the die 4 and substrate 10 during vertical movement of the die carrier 6 relative to the substrate carrier 16.

It should be noted that the present invention may be modified in a number of ways. For example, the optical probe 112 can be used in an automated assembly line or may be incorporated into a handheld instrument for manual assembly of microelectronic devices. The alignment of the die 4 and substrate 10 may also be performed by an automated system equipped with an image analyzer, or by an operator observing the superimposed images on a monitor or through a microscope. Prisms and other reflective surfaces may be added or removed as desired to accommodate the physical orientation or construction of the die carrier 6, the substrate carrier 16 or other components of the microelectronic assembly system, or to allow the superposition of additional images.

It should be understood that the embodiment described herein is merely exemplary and that a person skilled in the art may make many variations and modifications without departing from the spirit and scope of the present invention. All such variations and modifications, including those discussed above, are intended to be included within the scope of the invention as defined in the appended claims.

We claim:

1. An optical device for use in aligning a first object relative to a second object, comprising a first reflective surface;

a second reflective surface oriented so as to face the first object;

a third reflective surface positioned relative to said first and second reflective surfaces for reflecting an image of the first object, which is reflected from said second reflective surface, toward said first reflective surface;

a fourth reflective surface oriented so as to face the second object; and a fifth reflective surface positioned relative to said first and fourth reflective surfaces for reflecting an image of the second object, which is reflected from said fourth reflective surface, toward said first reflective surface, said first reflective surface being laterally offset relative to said second and fourth reflective surfaces, and said first reflective surface being partially reflective and being oriented such that at least a portion of the image of the first object reflected from said third reflective surface can be reflected by said first reflective surface in a lateral direction and such that at least a portion of the image of the second object reflected from said fifth reflective surface can pass through said first reflective surface in said lateral direction, thereby forming a substantially superimposed image of the first and second objects.

2. The optical device of claim 1, said first reflective surface defining a first plane;

said second reflective surface defining a second plane;

said third reflective surface defining a third plane parallel to said first plane and said second plane, said second reflective surface facing said third reflective surface and being on an opposite side of a reference plane from said third reflective surface, said fourth reflective surface defining a fourth plane; and said fifth reflective surface defining a fifth plane and facing said fourth reflective surface, said fifth plane intersecting said fourth plane at a 45 degree angle.

3. The optical device of claim 2, wherein a lowermost edge of said first reflective surface, an uppermost edge of said second reflective surface, a lowermost edge of said third reflective surface, and an uppermost edge of said fourth reflective surface are within said reference plane.

4. The optical device of claim 1, comprising at least one optical prism.

5. An optical prism assembly for use in aligning a first object relative to a second object, comprising a first optical prism having a first reflective surface;

a second optical prism having a second reflective surface oriented so as to face the first object;

a third optical prism having a third reflective surface positioned relative to said first and second reflective surfaces for reflecting an image of the first object, which is reflected from said second reflective surface, toward said first reflective surface;

a fourth optical prism having a fourth reflective surface oriented so as to face the second object and a fifth reflective surface positioned relative to said first and fourth reflective surfaces for reflecting an image of the second object, which is reflected from said fourth reflective surface, toward said first reflective surface, said first reflective surface being laterally offset relative to said second and fourth reflective surfaces, and said first reflective surface being partially reflective and being oriented such that at least a portion of the image of the first object reflected from said third reflective surface can be reflected by said first reflective surface in a lateral direction and such that at least a portion of the image of the second object reflected from said fifth reflective surface can be passed through said first reflective surface in said lateral direction, thereby forming a substantially superimposed image of the first and second objects.

6. The optical prism assembly of claim 5, wherein said first optical prism is a component of an optical cube beam splitter having a first normal transparent surface and a first transverse transparent surface adjacent to said first normal transparent surface, said first reflective surface being within said optical cube beam-splitter, said second optical prism has a right triangular base, a second normal transparent surface and a second transverse transparent surface adjacent to said second normal transparent surface, said second normal transparent surface and said second reflective surface defining a 45 degree angle, said third optical prism has a right triangular base, a third normal transparent surface, and a third transverse transparent surface adjacent to said third normal transparent surface, said third normal transparent surface and said third reflective surface defining a 45 degree angle; and said fourth optical prism having a fourth normal transparent surface, and a fourth transverse transparent surface adjacent to said fourth normal transparent surface and defining a right angle therewith, said fourth reflective surface facing said fifth reflective surface and defining a 45 degree angle therewith.

7. The optical prism assembly of claim 6, wherein said second normal surface contacts said third normal surface, said third transverse surface contacts said first transverse surface, and said fourth normal surface contacts said first normal surface.

8. The optical prism assembly of claim 7, wherein said second normal surface is co-extensive with said third normal surface, said third transverse surface is co-extensive with said first transverse surface, and said fourth normal surface is co-extensive with said first normal surface.

9. The optical prism assembly of claim 6, wherein said second transverse surface is opposite said fourth transverse surface.

10. The prism assembly of claim 7, including a second optical cube beam-splitter having a transverse surface facing said fourth transverse surface and a third optical cube beam-splitter having a transverse surface facing said second transverse surface.

11. An optical probe assembly for use in aligning a first object relative to a second object, comprising an optical device having a first reflective surface; a second reflective surface oriented so as to face the first object; a third reflective surface positioned relative to said first and second reflective surfaces for reflecting an image of the first object, which is reflected from said second reflective surface, toward said first reflective surface; a fourth reflective surface oriented so as to face the second object; and a fifth reflective surface positioned relative to said first and fourth reflective surfaces for reflecting an image of the second object, which is reflected from said fourth reflective surface, toward said first reflective surface, said first reflective surface being laterally offset relative to said second and fourth reflective surfaces, and said first reflective surface being partially reflective and being oriented such that at least a portion of the image of the first object reflected from said third reflective surface can be reflected by said first reflective surface in a lateral direction and such that at least a portion of the image of the second object reflected from said fifth reflective surface can be passed through said first reflective surface in said lateral direction, thereby forming a substantially superimposed image of the first and second objects; and means, positioned away from said optical device, for receiving said substantially superimposed image of the first and second objects and transforming said substantially superimposed image of the first and second objects to form a digital signal.

12. The optical probe assembly of claim 11, wherein said optical device includes at least one optical prism.

13. The optical probe assembly of claim 12, wherein said optical device is a prism assembly.

14. The optical probe assembly of claim 11, wherein said means for receiving and transforming said substantially superimposed image of the first and second objects include a camera positioned to capture said substantially superimposed image of the first and second objects.

15. The optical probe assembly of claim 11, including a sixth partially reflective surface facing said second reflective surface and positioned so as to be between said first object and said second reflective surface, a seventh partially reflective surface facing said fourth reflective surface and positioned so as to be between said second object and said fourth reflective surface; and at least one source of illumination positioned so as to illuminate the first object with light reflected from said sixth reflective surface and the second object with light reflected from said seventh reflective surface.

16. The optical probe assembly of claim 15, wherein said at least one source of illumination comprises a first source of illumination directed toward said sixth reflective surface and a second source of illumination directed toward said seventh reflective surface.

17. The optical probe assembly of claim 16, wherein said sixth reflective surface is positioned to reflect light transmitted from a direction perpendicular to a line connecting said second reflective surface and said third reflective surface, and said seventh reflective surface is positioned to reflect light transmitted from a direction perpendicular to a line connecting said fifth reflective surface and said first reflective surface.

* * * * *